(12) United States Patent
Sánchez Castro et al.

(10) Patent No.: US 10,733,391 B1
(45) Date of Patent: Aug. 4, 2020

(54) SWITCHING SCHEME FOR LOW OFFSET SWITCHED-CAPACITOR INTEGRATORS

(71) Applicant: Analog Devices International Unlimited Company, Limerick (IE)

(72) Inventors: Italo Carlos Medina Sánchez Castro, Torrent (ES); Adam James Glibbery, Paterna (ES); Christopher Peter Hurrell, Cookham (GB)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/526,439

(22) Filed: Jul. 30, 2019

Related U.S. Application Data (60) Provisional application No. 62/815,944, filed on Mar. 8, 2019.

(51) Int. Cl.
*G06G 7/186* (2006.01)
*H03M 3/00* (2006.01)
*H03H 19/00* (2006.01)

(52) U.S. Cl.
CPC ........... *G06G 7/186* (2013.01); *H03H 19/004* (2013.01); *H03M 3/458* (2013.01); *H03F 2200/264* (2013.01)

(58) Field of Classification Search
CPC combination set(s) only.
See application file for complete search history.

(56) References Cited

U.S. PATENT DOCUMENTS

| | | | |
|---|---|---|---|
| 4,365,204 A | 12/1982 | Haque | |
| 4,393,351 A | 7/1983 | Gregorian et al. | |
| 4,543,534 A | 9/1985 | Temes et al. | |
| 4,714,843 A | 12/1987 | Smith | |
| 4,894,620 A | 1/1990 | Nagaraj | |
| 5,111,072 A * | 5/1992 | Seidel | G11C 27/024 327/382 |
| 5,168,179 A | 12/1992 | Negahban-hagh | |
| 5,552,744 A | 9/1996 | Burlison et al. | |
| 5,841,310 A | 11/1998 | Kalthoff et al. | |
| 5,923,275 A | 7/1999 | Kalb | |
| 6,204,787 B1 * | 3/2001 | Baird | H03M 3/488 341/139 |

(Continued)

FOREIGN PATENT DOCUMENTS

| | | |
|---|---|---|
| EP | 1101287 B1 | 4/2003 |
| EP | 2259426 B1 | 10/2012 |

(Continued)

OTHER PUBLICATIONS

Ferguson, Paul F. Jr., "The Practical Design of Sigma Delta Data Converters", Analog Devices, MEAD short course, Lausanne, CH, [Particularly Slides 122-123], (Jul. 2001), 143 pgs.

(Continued)

*Primary Examiner* — Adam D Houston
(74) *Attorney, Agent, or Firm* — Schwegman Lundberg & Woessner, P.A.

(57) ABSTRACT

A switched-capacitor integrator is described having the contribution to offset from the charge injection mismatch of switches connected to the summing nodes mitigated by using a switching scheme that conveys basically all the charge injection to the output, thus preventing net offset from being integrated.

21 Claims, 5 Drawing Sheets

(56) References Cited

U.S. PATENT DOCUMENTS

| | | | |
|---|---|---|---|
| 6,348,781 B1* | 2/2002 | Midya | H03F 1/0227 323/222 |
| 6,493,404 B1* | 12/2002 | Iizuka | G06F 17/15 375/142 |
| 6,566,934 B1 | 5/2003 | Goren et al. | |
| 6,850,098 B2 | 2/2005 | Lee et al. | |
| 6,977,601 B1 | 12/2005 | Fletcher et al. | |
| 7,042,377 B2* | 5/2006 | Oliaei | H03M 3/344 341/143 |
| 7,164,379 B1 | 1/2007 | Rao | |
| 7,436,342 B2 | 10/2008 | Lauxtermann | |
| 7,830,293 B2 | 11/2010 | Karavidas et al. | |
| 7,852,254 B1 | 12/2010 | Ginetti | |
| 7,994,958 B2 | 8/2011 | Quiquempoix et al. | |
| 8,339,299 B2 | 12/2012 | Quiquempoix et al. | |
| 8,638,225 B1* | 1/2014 | Bocko | G07C 3/00 324/76.24 |
| 9,124,290 B2 | 9/2015 | Sherry et al. | |
| 2007/0290914 A1* | 12/2007 | Matsushita | H03M 1/005 341/155 |
| 2009/0140802 A1* | 6/2009 | Kitagawa | H03F 3/45475 330/9 |
| 2009/0179699 A1* | 7/2009 | Higuchi | H03K 5/2481 330/260 |
| 2009/0273386 A1 | 11/2009 | Korobeynikov et al. | |
| 2010/0045376 A1* | 2/2010 | Soenen | H03F 3/2173 330/251 |
| 2013/0049776 A1* | 2/2013 | Petkov | G01L 1/144 324/679 |
| 2013/0208631 A1* | 8/2013 | Dufrene | H04B 1/1036 370/277 |
| 2013/0249720 A1* | 9/2013 | Matsuura | H03M 1/06 341/118 |
| 2014/0155014 A1* | 6/2014 | Leung | H04B 1/16 455/318 |
| 2015/0123829 A1* | 5/2015 | Kim | G06G 7/184 341/143 |
| 2015/0194979 A1* | 7/2015 | Jiang | H04B 1/0003 455/550.1 |
| 2016/0197619 A1* | 7/2016 | Katayama | H03M 1/12 341/143 |
| 2016/0284420 A1* | 9/2016 | Huang | H03H 19/004 |
| 2017/0016776 A1* | 1/2017 | Ma | H03K 17/687 |
| 2018/0013410 A1* | 1/2018 | Yang | G06F 17/12 |
| 2018/0191359 A1* | 7/2018 | Petrov | H03L 7/093 |
| 2019/0253070 A1* | 8/2019 | Lee | H03M 3/37 |
| 2019/0354209 A1* | 11/2019 | Tang | G01S 7/52079 |
| 2019/0379392 A1* | 12/2019 | Miyahara | H03M 3/396 |

FOREIGN PATENT DOCUMENTS

| | | |
|---|---|---|
| EP | 3402079 A1 | 11/2018 |
| JP | 2892549 B2 | 5/1992 |

OTHER PUBLICATIONS

Razavi, Behzad, "Design of Analog CMOS Intergrated Circuits", McGraw-Hill Higher Education, (2001), 688 pgs.

Sreenath, Vijayakumar, et al., "A Robust Switched-Capacitor CDC", IEEE Sensors Journal, 18(14), (2018), 8 pgs.

* cited by examiner

SWITCHING SCHEME FOR LOW OFFSET SWITCHED-CAPACITOR INTEGRATORS

CLAIM OF PRIORITY

This application claims the benefit of priority of U.S. Provisional Patent Application Ser. No. 62/815,944, titled "SWITCHING SCHEME FOR LOW OFFSET SWITCHED-CAPACITOR INTEGRATORS" to Italo Carlos Medina Sanchez Castro et al., filed on Mar. 8, 2019, the entire contents of which being incorporated herein by reference.

FIELD OF THE DISCLOSURE

This document pertains generally, but not by way of limitation, to integrated circuits, and more particularly, to switched capacitor circuits.

BACKGROUND

Switched-capacitor circuits typically include switches and capacitors, often along with amplifiers, in arrangements configured to implement specific input-to-output transfer functions. For example, switched-capacitor circuits can be used to implement gain stages, filters, D/A converters, and many other types of circuits. The switches of switched-capacitor circuits are selectively switched on and off by clock signals to realize the transfer functions.

Switched-capacitor circuits have widespread use due to the advancement of Complementary Metal-Oxide-Semiconductor (CMOS) technology. CMOS technology is commonly used to implement switched-capacitor circuits because of the availability of Field-Effect Transistor (FET) switches and operational amplifiers (op amps) with low input bias currents. One common type of switched-capacitor circuit is a switched-capacitor integrator. Such CMOS switched-capacitor integrator circuits typically include switches, capacitors and op amps.

SUMMARY OF THE DISCLOSURE

This disclosure is directed to, among other things, a switched-capacitor integrator having its contribution to offset from the charge injection mismatch of switches connected to the summing nodes mitigated by using a switching scheme that conveys basically all the charge injection to the output, thus preventing net offset from being integrated.

In some aspects, this disclosure is directed to a switched-capacitor integrator circuit including an amplifier, at least one input capacitor configured to receive at least one input signal and to convey it to the input of the amplifier, and at least one capacitor coupled to the amplifier in a feedback configuration, the switched capacitor integrator circuit comprising: at least two switches coupled to each plate of the at least one input capacitor, wherein at least one of the at least four switches includes a compound switch including a parallel combination of: a first transistor having a first width; and a second transistor having a second width greater than the first width, wherein a control circuit is configured to control operation of the first and second transistors of the at least one compound switch such that while the first transistor is closed, the second transistor is opened, and then the first transistor is opened.

In some aspects, this disclosure is directed to a method of operating a switched-capacitor integrator circuit including an amplifier, at least one input capacitor configured to receive at least one input signal and to convey it to the input of the amplifier, at least one capacitor coupled to the amplifier in a feedback configuration, and at least two switches coupled to each plate of the at least one input capacitor, wherein at least one of the at least four switches includes a compound switch, the method comprising: controlling operation of the compound switch having a parallel combination of: a first transistor having a first width; and a second transistor having a second width greater than the first width, including: turning the second transistor OFF while the first transistor is ON and then turning the first transistor OFF.

In some aspects, this disclosure is directed to a switched-capacitor integrator circuit including an amplifier, an input capacitor configured to receive an input signal, and a capacitor coupled to the amplifier in a feedback configuration, the switched capacitor integrator circuit comprising: at least one compound switch coupled to a plate of the input capacitor, wherein the compound switch includes a parallel combination of: a first transistor having a first width; and a second transistor having a second width greater than the first width, wherein the at least one compound switch is configured to be coupled between an input of the amplifier and the input capacitor.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The analog integrator is a widely used signal processing block. The Switched-Capacitor (SC) implementation of the integrator is very popular, especially for Field-Effect-Transistor (FET) technology, due to advantages in terms of accuracy and versatility. The integrators can be, in general, sensitive to offset because they will naturally integrate it over time, causing inaccurate results and, potentially, saturating the device.

In the case of the FET SC integrators, the effect of the majority of offset sources is effectively cancelled by techniques known in the state-of-the-art. However, the potential offset contributed by the mismatch in the charge injection of the switches connected to the summing nodes of the FET SC integrator are mitigated, in the state-of-the-art, by trading settling time or by averaging its effect over time instead of, as it would be preferable in many situations, intrinsically cancelling it.

An underlying issue, not satisfactorily addressed in the state-of-the-art, is a trade-off between the magnitude of the offset contribution associated with the charge injection mismatch and the settling time impact of the corresponding switches. This disclosure presents a technique that intrinsically mitigates this offset contribution without trading settling time.

This disclosure is directed to, among other things, a switched-capacitor integrator having its contribution to offset from the charge injection mismatch of switches connected to the summing nodes mitigated by using a switching scheme that conveys basically all the charge injection to the output, thus preventing net offset from being integrated.

Figure 1:
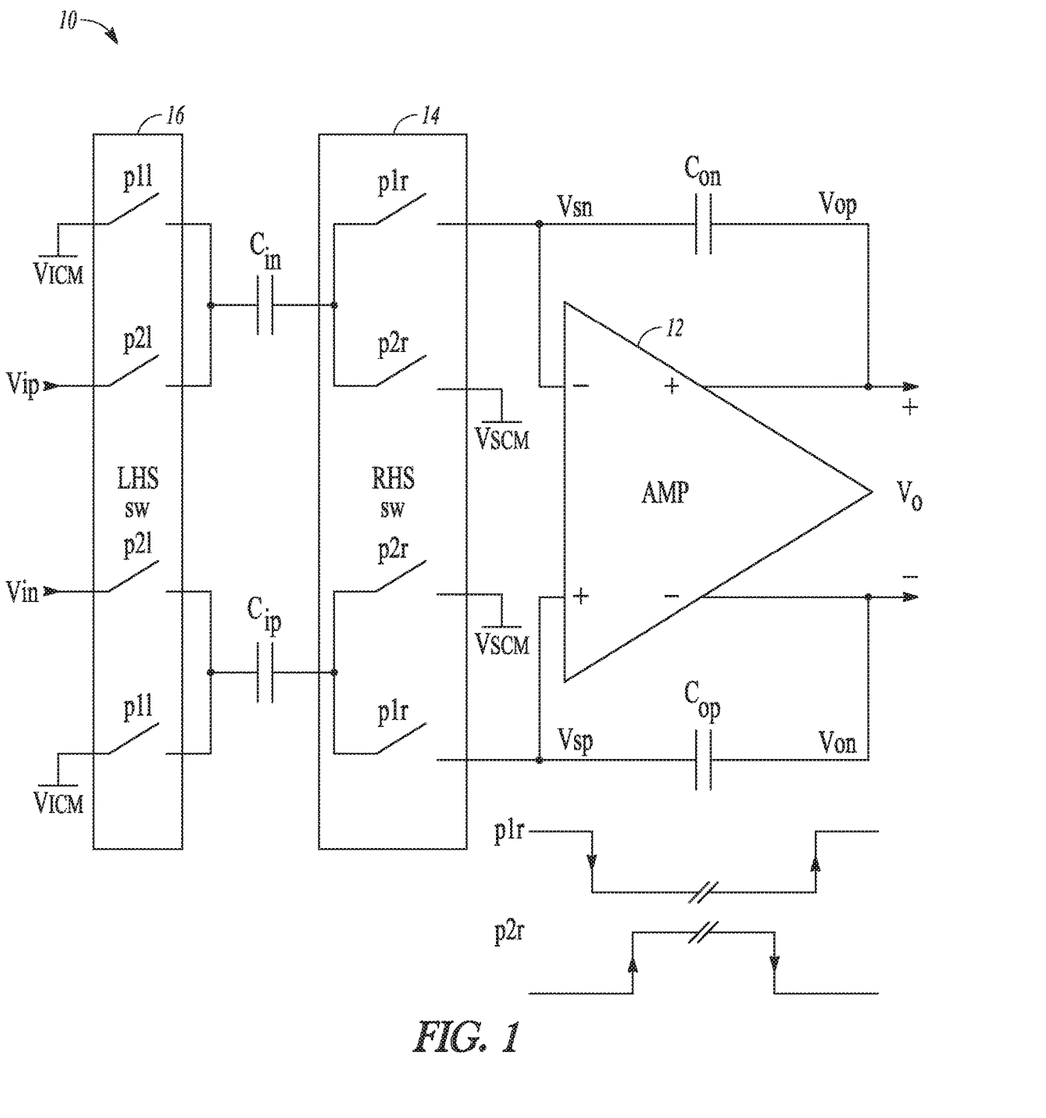
FIG. 1 is a schematic diagram of an example of a switched capacitor (SC) integrator.

FIG. 1 is a schematic diagram of an example of a switched capacitor integrator. The example shown in FIG. 1 is a fully-differential implementation of an SC integrator.

The SC integrator operation is based, as in any SC circuit, on using switches to force voltages into capacitors. Since FET technology allows a competitive implementation of both switches and capacitors, the SC circuits are especially attractive for embodiments in FET and related technologies. Hence, this disclosure primarily refers to such technologies.

The fully-differential SC integrator circuit 10 in FIG. 1 can be formed by an amplifier (amp) 12 operating in a negative feedback configuration through some feedback capacitors $C_{op}$, $C_{on}$ connected between the output nodes $V_{op}$, $V_{on}$, and the summing nodes $V_{sp}$, $V_{sn}$, and a SC input network that conveys a charge to $V_{sp}$, $V_{sn}$ from the differential input $V_i = V_{ip} - V_{in}$. The feedback capacitors $C_{op}$, $C_{on}$ retain the state of the differential output $V_o = V_{op} - V_{on}$ of the integrator.

A set of switches, e.g., transistors, connect the Right-Hand-Side (RHS) terminals of the input capacitors $C_{ip}$, $C_{in}$ to the summing nodes $V_{sp}$, $V_{sn}$. These switches are labelled as RHS switches 14. Another set of switches, e.g., transistors, connect the Left-Hand-Side (LHS) terminals of $C_{ip}$, $C_{in}$ to the input terminals $V_{ip}$, $V_{in}$. These switches are labelled as LHS switches 16.

As in any SC circuit, the operation is controlled by at least two clock phases, which are non-overlapping to avoid undesired loss of charge from the relevant capacitors. These clock phases are labeled as p1, p2 in FIG. 1, and further distinguished between RHS phases (labeled as p1r, p2r) and LHS phases (labeled as p1l, p2l). A complete clock cycle includes all these phases and defines a period $T_{CLK}$ that sets the frequency of operation $f_{CLK} = 1/T_{CLK}$ (sampling frequency) of the SC integrator.

The RHS phases p1r, p2r drive the RHS switches 14, while the LHS phases p1l, p2l drive the LHS switches 16.

In a given phase (in this case, p2) $V_{ip}$, $V_{in}$ are sampled in $C_{ip}$, $C_{in}$ by connecting the LHS terminal of $C_{ip}$, $C_{in}$ to the corresponding $V_{ip}$, $V_{in}$ and the RHS terminal of $C_{ip}$, $C_{in}$, to the Common-Mode (CM) summing node voltage $V_{SCM}$. Therefore, a differential charge $Q_i$ is sampled into $C_{ip}$, $C_{in}$ given by (assuming $C_{ip} = C_{in} = C_i$):

$$Q_i = C_i \cdot V_i \qquad \text{Equation (1)}$$

In the next phase (in this case, p1), $Q_i$ is forced into the feedback capacitors $C_{op}$, $C_{on}$ by connecting the LHS terminal of $C_{ip}$, $C_{in}$ to the common mode (CM) input voltage $V_{ICM}$ and the RHS terminal of $C_{ip}$, $C_{in}$, to the summing nodes $V_{sp}$, $V_{sn}$. This causes a differential step $\Delta V_o$ in the integrator output that can be expressed as (assuming $C_{op} = C_{on} = C_o$, and applying Equation 1):

$$\Delta V_o = \frac{Q_i}{C_o} = \frac{C_i}{C_o} \cdot V_i \qquad \text{Equation (2)}$$

Consequently, the SC integrator exhibits a discrete time operation in which the output $V_o(n)$ corresponding to instant n becomes available at the end of the corresponding clock cycle (in this case, at the end of p1) and it modifies the previously held output $V_o(n-1)$ with the input $V_i(n-\frac{1}{2})$ sampled during the previous phase:

$$V_o(n) = V_o(n-1) + \frac{C_i}{C_o} \cdot V_i(n-1/2) \qquad \text{Equation (3)}$$

From Equation 2, the ideal gain of the SC integrator is set by the ratio $C_i/C_o$ of the input and feedback capacitors.

If the switches are implemented by FET transistors, a charge Q is injected into the terminals of the switch every time its state transitions. This non-ideal effect, called charge injection, is well-known and regarded as a prominent drawback of FET technology.

This charge Q is formed, mainly, by 2 components: the charge trapped in the channel $Q_{ch}$ and the clock-feedthrough charge $Q_{clk}$ due to gate-source coupling. Therefore, Q can be quantified as (where W is the width of the transistor, L is the effective length of the transistor, $C_{ox}$ is the gate-oxide capacitance per unit area, $C_{ov}$ is the gate-source overlapping capacitance per unit width, $V_{GS}$ is the gate-source voltage, $V_{TH}$ is the threshold voltage, $V_H$ is the clock high voltage level and $V_L$ is the clock low voltage level):

$$Q = Q_{ch} + Q_{clk} = W \cdot L \cdot C_{ox} \cdot (V_{GS} - V_{TH}) + W \cdot C_{ov} \cdot (V_H - V_L) \qquad \text{Eq. (4)}$$

In FIG. 1, the relative timing of p1r, p2r is shown and the non-overlapping nature of these clock signals is illustrated. The LHS phases p1l, p2l are typically a version of the corresponding RHS phase p1r, p2r with the sampling edge delayed to avoid sampling the input-dependent charge injection (see Equation 4) of the LHS switches into the input capacitors $C_{ip}$, $C_{in}$ by making them float when p1l or p2l transitions. This technique, known as bottom-sampling, prevents the LHS charge injection from inducing nonlinearity and is widely used in SC circuits. The RHS switches terminals are held to a voltage $V_{SCM}$; therefore, their associated charge injection is basically input-independent and, hence, only tends to cause an offset.

The sampling edge of a given phase is the one opening the corresponding switch; as a convention, the falling edge is assumed as the sampling one in this disclosure. Since the sampling edge of p1r, p2r precedes the one associated with the corresponding LHS phase p1l, p2l, the RHS sampling in each phase can be considered as the effective sampling of the integrator.

FET SC Integrator Offset Sources

In a well-designed fully-differential integrator, the offset is dominated by the mismatch of nominally identical components.

For FET SC fully-differential integrators, the relevant offset contributions, in practice, are:

The amplifier (amp) offset induced by transistors mismatches that exist, chiefly, in its input stage.

The LHS switches charge injection mismatch (which would cause also non-linearity).

The RHS switches charge injection mismatch.

The offset $\Delta V_{OS}$ integrated as a result of an error present in the summing nodes in the form of a voltage $V_\varepsilon$ is proportional to the integrator gain, $\Delta V_{OS}(V_\varepsilon) \propto (C_i/C_o) \cdot V_\varepsilon$. This is the case, notably, for the amp 12 offset.

The offset $\Delta V_{OS}$ integrated as a result of an error present in the summing nodes in the form of a charge $Q_\varepsilon$ (as, for instance, the RHS switches charge injection mismatch) is inversely proportional to the feedback capacitor $C_o$, $\Delta V_{OS}(Q_\varepsilon) \propto Q_\varepsilon/C_o$.

The effect of charge $Q_p$, $Q_n$ injected, respectively, into the summing nodes $V_{sp}$, $V_{sn}$ would be $\Delta V_{OS}(Q_p, Q_n) \propto (Q_p - Q_n)/C_o$; therefore, the resulting offset is proportional to the absolute charge mismatch $\Delta Q = Q_p - Q_n$ rather than to the relative mismatch $\Delta Q/Q = (Q_p - Q_n)/[(Q_p + Q_n)/2]$. As a result, increasing the nominal value Q of $Q_p$, $Q_n$ would not be an effective method to minimize their effect (as it is the case for magnitudes that depends on relative mismatches), instead, reducing Q would be more effective (assuming that the absolute mismatch $\Delta Q$ scales with Q, which is typically the case).

The effect of the amp offset in the integrator output can be effectively mitigated by techniques such as chopping. The offset induced by charge injection mismatch from the LHS switches can be effectively cancelled by bottom sampling, as previously described.

The contribution to offset by charge injection mismatch from RHS switches can be minimized by any combination of the following approaches:

Increasing the size of the feedback capacitor $C_o$(possibly, scaling proportionally the input capacitor $C_i$ to keep the same gain).

Reducing the magnitude of the charge injection by, as suggested by Equation 4, decreasing the voltage overdrive $V_{GS}-V_{TH}$ and/or, the gate area W·L (the latter being, in general, more practical).

Chopping the RHS switches at a frequency $f_{RHS}$ to cancel the offset induced by the RHS switches charge injection mismatch by averaging its integration with opposite polarities over consecutive chopping semi-periods $T_{RHS}/2=2/f_{RHS}$.

Increasing $C_o$ implies increasing the settling time for a given power.

Reducing $V_{GS}-V_{TH}$ will also impact the settling time because the on resistance $R_{ON}$ of the switch (given approximately by Equation 5, where $\mu$ is the mobility of charge carriers) would be proportionally increased.

$$R_{ON} = \frac{1}{\mu \cdot C_{ox} \cdot \frac{W}{L} \cdot (V_{GS} - V_{TH})} \qquad \text{Equation (5)}$$

Similarly, reducing W·L (once L is at its technological minimum or, equivalently, reducing W·L at the cost of reducing W/L) will trade offset by settling time for a given power.

The chopping of the RHS switches can be implemented by a chopper and a dechopper around the RHS switches operating at $f_{RHS}$. This represents a non-negligible overhead for the clock phase generation and switch driving circuitry of the SC integrator.

Since the switches of the chopper and dechopper are in series with the RHS switches, to recover the original settling time for a given power, the W·L of these switches can be sized to obtain an equivalent on resistance $R_{ON}$ comparable to the one of the original RHS switches. Therefore, the absolute charge injection mismatch of the RHS switches increases (for a given settling time), but its potential contribution to the integrator offset is mitigated by averaging it over a period $T_{RHS}$.

The switches of the chopper and dechopper also contribute to offset by the mismatch of their charge injection. Therefore, to obtain a net offset improvement, the chopping frequency $f_{RHS}$ must be smaller than the sampling frequency $f_{CLK}$ to reduce the equivalent induced offset by a ratio $f_{CLK}/f_{RHS}>1$ due to time averaging, thus making it acceptable.

In such a scheme, the chopped offset component $\Delta V_{OS}$ induced by the RHS switches charge injection mismatch is present in the SC integrator output $V_o$ as a square waveform of frequency $f_{RHS}$.

The fact that $f_{RHS}<f_{CLK}$ implies that the component is not canceled in each integration cycle (because that would require $f_{RHS}=f_{CLK}$). Therefore, the corresponding square waveform would be processed by the circuitry following the integrator, potentially causing distortion. This technique relies on some post-processing that filters the created offset tone or mitigates its effect, which is not an attractive feature in general. To avoid this situation, the technique that cancels the RHS switches charge injection mismatch offset must operate at the sampling frequency $f_{CLK}$.

Consequently, based on the above, the techniques known in the state-of-the-art for mitigating the offset induced by the RHS switches charge injection mismatch involve a direct trade-off between offset and settling time (for a given power and technology) and/or the presence of tones. A solution that addresses these drawbacks is desirable.

Solution

This disclosure describes a solution for mitigating the offset induced by the RHS switches charge injection mismatch that can be dynamic (to cancel also offset drift), can operate at the sampling frequency $f_{CLK}$ (to avoid the presence of potentially undesired tones) and can break the trade-off between offset and settling time established previously.

The effect of charge injection mismatch in the offset of a typical SC integrator is analyzed in detail below. Without loss of generality, and in order to simplify the analysis, only the mismatch associated with the pair of RHS switches 14 driven by p1r is considered. Moreover, only the mismatched charge injection $\Delta Q$ is considered for the analysis (since the common charge injection does not have net effect in the integrated output), arbitrarily allocating all the mismatch to a single switch and, thus, assuming that the complementary one does not contribute charge injection. This is illustrated in FIG. 2.

Figure 2:
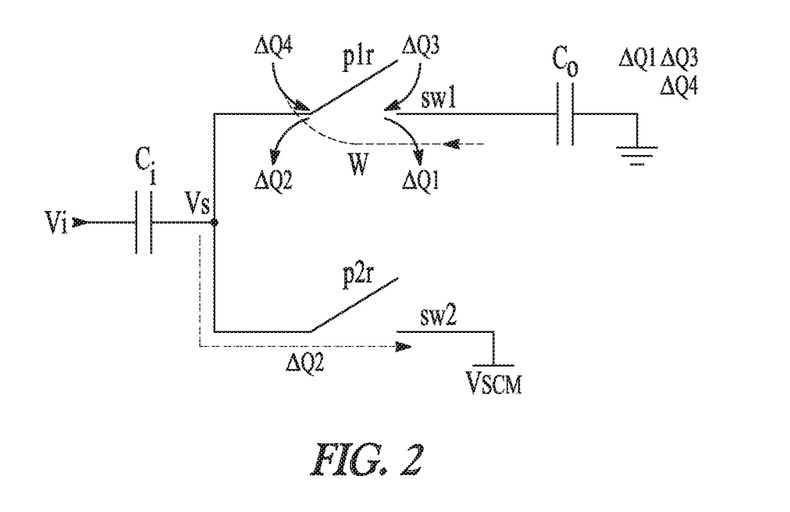
FIG. 2 is a schematic diagram of an equivalent circuit of a portion of the relevant SC network of the SC integrator of FIG. 1.

FIG. 2 is a schematic diagram of an equivalent circuit of the relevant portion of the SC (single ended) network of the SC integrator of FIG. 1. In particular, FIG. 2 depicts typical SC integrator RHS switching for a portion of the SC integrator circuit of FIG. 1.

The charge injection of switch sw1 is described next for the associated transitions of the clock signals. The relevant events, in chronological order, are:

p1r goes low (sampling): a charge $\Delta Q_1$ is injected into $C_o$ (causing a step $\Delta V_1 = \Delta Q_1/C_o$ in the integrator output $V_o$) and a charge $\Delta Q_2$ is injected into $C_1$, being stored.

p2r goes high ($C_i$ RHS plate is reset): the charge $\Delta Q_2$ previously stored in $C_i$ is dumped into the AC ground $V_{SCM}$ and, thus, permanently lost.

p1r goes high (the next integration phase begins): a charge $\Delta Q_3$ is injected into $C_o$ (causing a step $\Delta V_3 = \Delta Q_3/C_o$ in the integrator output $V_o$) and a charge $\Delta Q_4$ is injected into $C_i$ but, since the amplifier is reconnected by the closing of sw1, $\Delta Q_4$ is provided by the amplifier (causing a step $\Delta V_4 = \Delta Q_4/C_o$ in $V_o$).

Therefore, the following offset $\Delta V_o$ in the integrator output $V_o$ is caused each cycle by the charge injection mismatch of the RHS switches driven by p1r:

$$\Delta V_o = \Delta V_1 + \Delta V_3 + \Delta V_4 = \frac{\Delta Q_1 + \Delta Q_3 + \Delta Q_4}{C_o} \quad \text{Equation (6)}$$

The charge injection of a FET switch (given by Equation 4) is divided between its 2 terminals (arbitrarily designated as the drain and source). This division is not necessarily symmetrical and depends on a number of factors such as the relative impedance of the terminals and the slope of the transition in the gate signal. Modelling this using a division factor $0 \leq d \leq 1$, the charge injection $Q_T$ of a FET switch is divided among its terminals as $Q_d$, $Q_s$ as:

$$Q_T = Q_d + Q_s, \; Q_d = (1-d) \cdot Q_T, \; Q_s = d \cdot Q_T \quad \text{Equation (7)}$$

Moreover, the charge injection $Q_T$ of a FET switch during a falling and a rising transition at its gate signal is the same in magnitude for given terminal voltages.

In the case of FIG. 2, these facts imply:

$$\Delta Q_1 + \Delta Q_2 = -(\Delta Q_3 + \Delta Q_4) \quad \text{Equation (8)}$$

Consequently, if $\Delta Q_2$ were integrated instead of dumped, $\Delta V_o = 0$ according to Equation 7. In other words, if all the charge injected when opening and closing switch sw1 is integrated, the net effect is null at the integrator output $V_o$ and the charge injection mismatch associated with sw1 does not induce offset.

A similar analysis can be done for the RHS switch sw2 connected to the Common-Mode (CM) summing node voltage $V_{SCM}$ and driven, in this case, by p2r. The conclusion is the same but, instead of being all the associated charge injection integrated to cancel the effect at $V_o$, all the charge injection of switch sw2 would be dumped into $V_{SCM}$ and, similarly, no offset is induced at $V_o$. Hence, the obtained result is applicable to any RHS switch.

The following principles have been extracted from the above description, in connection with the offset induced by the charge injection mismatch of RHS switches in a SC integrator:

I. The induced offset depends on the absolute charge injection mismatch, and
II. If all the charge injection of the RHS switches is integrated, the net effect is null at the integrator output.

Taking into account these two principles, the following solution is proposed to mitigate the offset induced by the charge injection mismatch of RHS switches without impacting the settling time: adding a smaller switch in parallel with the main RHS switch of regular size and driving it in such a way that it opens only after the main switch has opened to have all the charge injection of the main RHS switch integrated. As a result, the residual offset depends on the absolute charge injection mismatch of the smaller switch which will be smaller (by Equation 4) than the one caused by the regular-sized main RHS switch. A possible impact in the equivalent settling time caused by such technique can be mitigated by properly sizing the relative impedance (through the aspect ratio W/L) of both switches and the delay $T_{DLY}$ between the opening edges of their driving signals.

Figure 3:
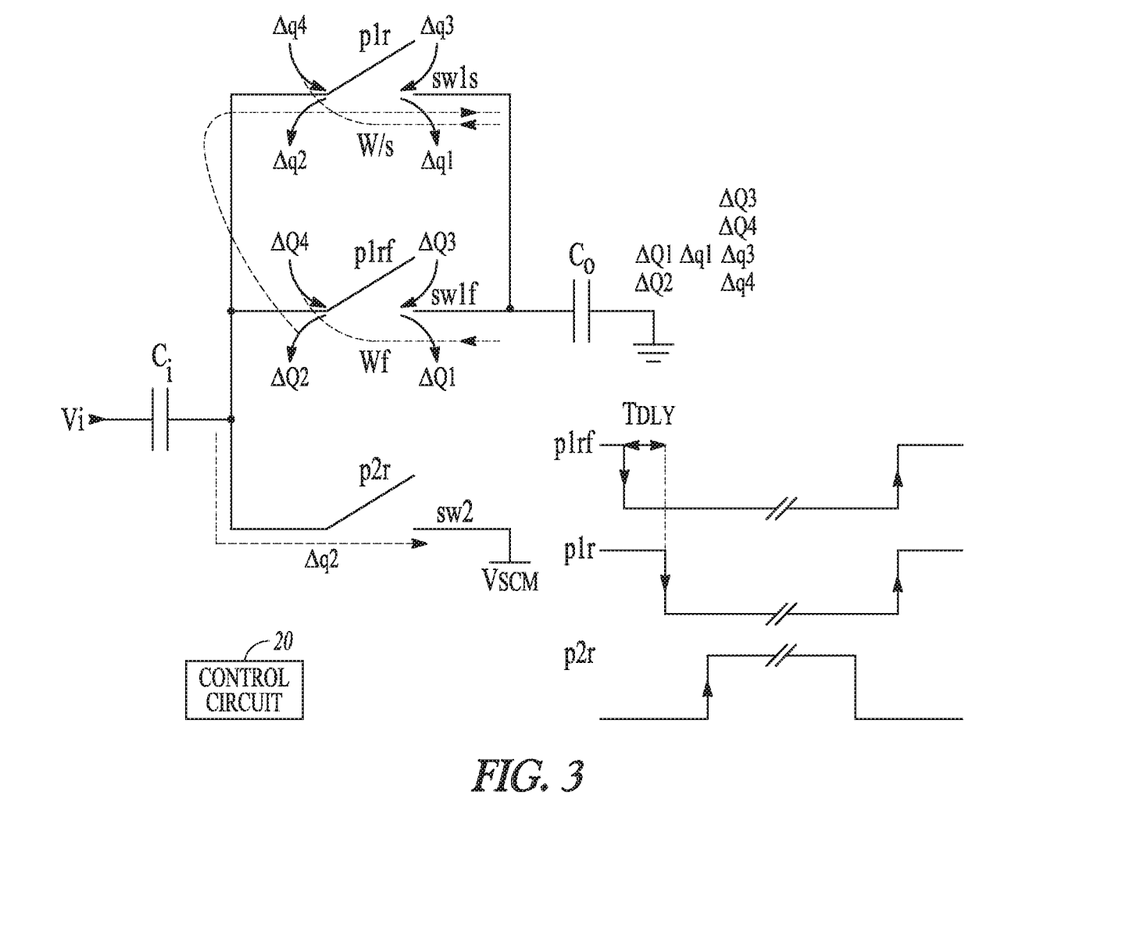
FIG. 3 is a schematic diagram of an equivalent circuit of a portion of an SC integrator using various techniques of this disclosure.

FIG. 3 is a schematic diagram of an equivalent circuit of a portion of an SC integrator using various techniques of this disclosure. In particular and in accordance with this disclosure, FIG. 3 depicts an SC integrator RHS parallel switching scheme that uses a smaller switch in parallel with the main RHS switch of regular size and drives it in such a way that it opens only after the main RHS switch has opened to have all the charge injection of the main RHS switch integrated. Together, these two switches, e.g., transistors, form what this disclosure refers to as a "compound switch", which includes a parallel combination of a first transistor (switch sw1s) having a first width (W/s) and a second transistor (switch sw1f) having a second width ($W_f$) greater than the first width. As described below, a compound switch can be formed of more than two transistors.

The RHS switch sw1 of FIG. 2 has been replaced by the parallel combination of a switch sw1s having a width scaled down by a factor s (e.g., W/s) and driven by the original phase p1r and a switch sw1f driven by a new phase p1rf, as seen in FIG. 3. In some example configurations, the scaling factor is within a range of 5 and 20, inclusive. Again, this parallel combination is referred to as a compound switch in this disclosure.

The timing of the switches is controlled by a control circuit 20. The control circuit is configured to control operation of the first sw1s and second sw1f switches, e.g., transistors, of the compound switch such that while the first switch is closed, the second switch is opened, and then the first switch is opened.

In some example configurations, the control circuit is configured to control operation of the first switch using a first clock signal and control operation of the second switch using a second clock signal, where the first clock signal is different from the second clock signal. In some examples, first clock signal, e.g., p1r, has a first active time and the second clock signal, e.g., p1rf, has a second active time, where the second active time is shorter than the first active time.

The switch sw1s can be referred to as a slow switch because, since its width W/s is smaller by a scaling factor s compared to the regular RHS switch sw1 of FIG. 2, its impedance is larger by the same factor s (according to Equation 5). Correspondingly, its charge injection is smaller than the one associated with switch sw1 by the scaling factor s (according to Equation 4). This is illustrated in FIG. 3 by labelling the associated charges by small letter $\Delta q_i$. The sw1s switch is driven by the original p1r phase and, hence, it dictates the sampling event in the integrator operation.

The switch sw1f can be referred to as a fast switch because its impedance, compared to the one associated with the slow switch sw1s, is smaller since its width $W_f$ is bigger ($W_f > W/s$). It is driven by a new phase p1rf, generated from p1r but with the opening edge advanced by a time delay $T_{DLY}$ (as shown in the qualitative timing diagram of FIG. 3).

The charge injection of the equivalent switch formed by sw1s and sw1f is next described for the associated transitions of the clock signals. The relevant events, in chronological order, are:

p1rf goes low: a charge $\Delta Q_1$ is injected into $C_o$ (causing a step $\Delta V_1 = \Delta Q_1/C_o$ in the integrator output $V_o$) and a charge $\Delta Q_2$ is injected into $C_o$ by means of sw1s being closed (causing a step $\Delta V_2 = \Delta Q_2/C_o$ in the integrator output $V_0$).

p1r goes low (sampling): a charge $\Delta q_1$ is injected into $C_o$ (causing a step $\Delta v_1 = \Delta q_1/C_o$ in the integrator output $V_o$) and a charge $\Delta q_2$ is injected into $C_i$, being stored.

p2r goes high ($C_i$ RHS plate is reset): the charge $\Delta q_2$ previously stored in $C_i$ is dumped into the AC ground $V_{SCM}$ and, thus, permanently lost.

p1r and pr1f goes high (the next integration phase begins): a charge $\Delta Q_3$ is injected into $C_o$ (causing a step $\Delta V_3 = \Delta Q_3/C_o$ in the integrator output $V_o$) and a charge $\Delta Q_4$ is injected into $C_i$ but, since the amplifier is reconnected by the closing of sw1f and sw1s, $\Delta Q_4$ is provided by the amplifier (causing a step $\Delta V_4 = \Delta Q_4/C_o$ in $V_o$); a charge $\Delta q_3$ is injected into $C_o$ (causing a step $\Delta v_3 = \Delta q_3/C_o$ in $V_o$) and a charge $\Delta q_4$ is injected into $C_1$ but, since the amplifier is reconnected by the closing of sw1f and sw1s, $\Delta q_4$ is provided by the amplifier (causing a step $\Delta v_4 = \Delta q_4/C_o$ in $V_o$)

Therefore, the following offset $\Delta V'_o$ in the integrator output $V_o$ is caused each cycle by the charge injection mismatch of the equivalent RHS switches:

$$\Delta V'_o = V_1 + V_2 + v_1 + V_3 + V_4 + v_3 + v_4 = \frac{\Delta Q_1 + \Delta Q_2 + \Delta q_1 + \Delta Q_3 + \Delta Q_4 + \Delta q_3 + \Delta q_4}{C_o} \quad \text{Equation (9)}$$

Applying Equation 8 to sw1f, the net effect of the associated charge injection is cancelled. Hence, Equation 9 simplifies to:

$$\Delta V'_o = \frac{\Delta q_1 + \Delta q_3 + \Delta q_4}{C_o} \quad \text{Equation (10)}$$

Assuming, without loss of generality, that the division factor d of sw1s charge injection is the same as the one for sw1 in FIG. 2, the ratio of the induced offsets for both approaches becomes (from Equation 10, 8 and 6):

$$\frac{\Delta V'_o}{\Delta V_o} = \frac{\Delta q_1 + \Delta q_3 + \Delta q_4}{\Delta Q_1 + \Delta Q_3 + \Delta Q_4} \quad \text{Equation (11)}$$

Since the only difference between both switches is the scaling of the width described previously (the width of sw1s is W/s if the width of sw1 is W), from Equation 4 and 11:

$$\Delta V'_o = \frac{\Delta V_o}{s} \quad \text{Equation (12)}$$

Therefore, a SC integrator including the RHS switch implemented by the new approach (illustrated in FIG. 3 and referred to as a Parallel Switching Technique) presents a reduction in offset $\Delta V'_o$ induced by RHS switch charge injection mismatch compared to the traditional approach (illustrated in FIG. 2) that is proportional to the width (or, in general, gate area) ratio s of the RHS switches performing the sampling in each case (sw1s in FIG. 3 for the Parallel Switching Technique and sw1 in FIG. 2 for the traditional approach).

Again, a similar analysis can be performed by applying the Parallel Switching Technique to the RHS switch sw2 in FIG. 3. The conclusion is the same but, instead of being all the associated charge injection components of sw2 integrated to cancel their effect at $V_o$, all can be dumped into $V_{SCM}$. Hence, the obtained result is applicable to any RHS switch in a SC integrator.

These results have been derived assuming, for convenience, a systematic mismatch in the charge injection. For the more relevant case of random mismatch, the principles can extend directly, and the corresponding analysis yields a reduction in the induced offset given by $\sqrt{s}$ (assuming the realistic case of normal distribution of the charge injection random mismatch).

The fast switch (sw1f in FIG. 3) is only closed during a fraction of the p1r phase (as dictated by the time delay $T_{DLY}$). Its function is to allow the transmission of most of the input charge before it opens, the moment at which the slow switch (sw1s in FIG. 3) completes the fine settling during the remaining of the p1r phase ($T_{DLY}$) before opening to sample.

Therefore, to obtain an equivalent settling time comparable to the one achievable by the approach illustrated by FIG. 2, the on resistance of sw1f must be smaller than the on resistance of sw1. Similarly, the width W of sw1f can be bigger than the one associated with sw1 W($W_f$>W).

Since the offset induced by the charge injection mismatch does not depend on sw1f (Equation 10), $W_f$ can be sized (along with time delay $T_{DLY}$) to provide the desired settling time without impacting the resulting offset. Therefore, the trade-off between charge injection mismatch induced offset and settling time is effectively solved by the Parallel Switching Technique of this disclosure that operates at the sampling frequency $f_{CLK}$ (thus, avoiding potential undesired tones).

The opening edge of sw1f (phase p1rf going low in FIG. 3) can cause a perturbation that must be settled by sw1s during $T_{DLY}$ along with the fine settling of the input signal charge transmission. Therefore, the sw1f opening should happen enough in advance of the effective sampling (opening edge of sw1s) and/or the sw1f gate area should be small enough to limit the size of the corresponding perturbation.

Both parameters can be sized to obtain the targeted settling performance while keeping the sw1s gate area as small as required (or, equivalently, sizing the scaling factor s as aggressively as required) to simultaneously achieve a residual offset as low as desired.

The increase in power, area and complexity incurred by implementing the corresponding RHS switches by the described Parallel Switching Technique (illustrated by FIG. 3) compared to the other approach (illustrated by FIG. 2) is, in practice, negligible and dominated by the generation and routing of the additional clock signal p1rf (which is p1r with the sample edge advanced by a given time interval).

Figure 4:
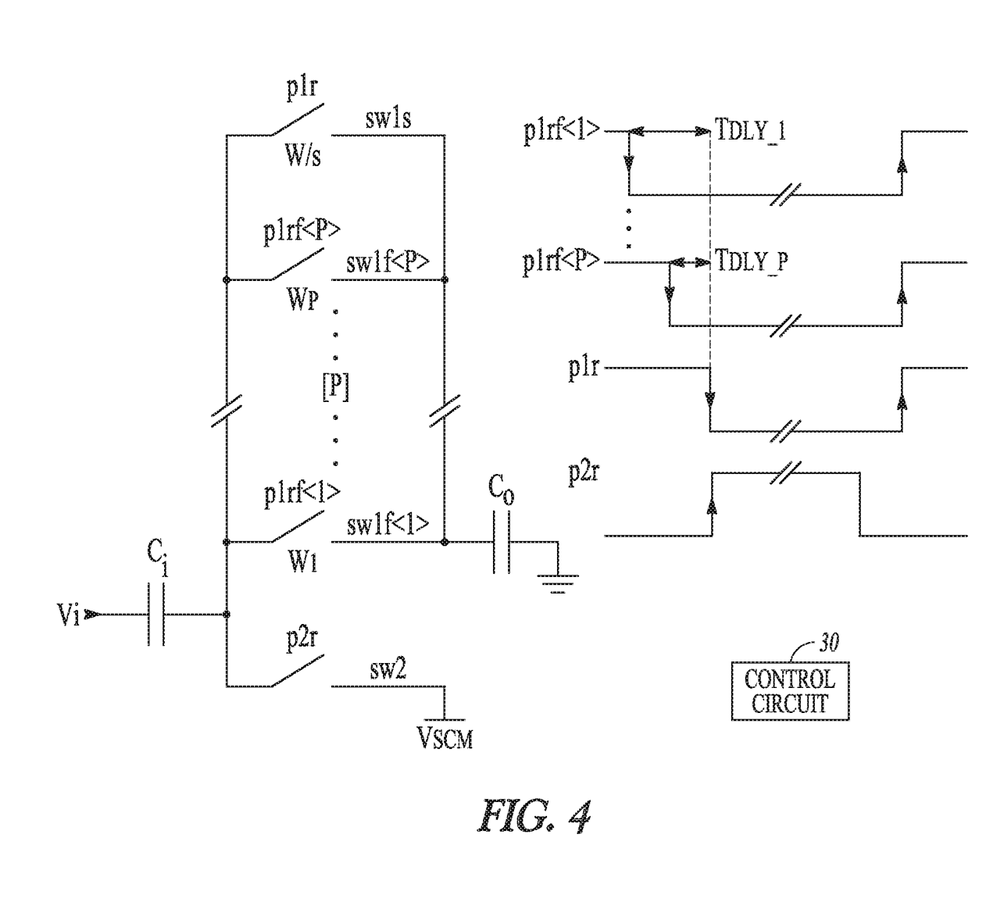
FIG. 4 is an example of a generalized compound switch that can be used to implement the Parallel Switching Techniques of this disclosure.

FIG. 4 is an example of a generalized compound switch that can be used to implement the Parallel Switching Techniques of this disclosure. A more gradual operation of the Parallel Switching Technique can be obtained by considering a number P of fast switches in parallel with the slow switch sw1s.

In FIG. 4 an array of fast switches sw1f<P:1> can be driven by dedicated clock signals p1rf<P:1> via a control circuit 30. The array of fast switches sw1f<P:1> open sequentially during the sampling, thus providing the same operation as the Parallel Switching Technique described above but with more flexibility to manage the perturbation of the fast switching.

Essentially, the closer the opening edge of a given fast switch sw1f<i> is to the sampling edge of the slow switch sw1s (that is, the smaller the associated delay $T_{DLY\_i}$), the smaller its corresponding gate area (the width $W_i$, in practice) can be advantageously sized to cause less charge injection and, thus, a smaller settling perturbation. This is feasible because the closer to the sampling edge a sw1*f*<i> opens, the less it needs to contribute to the remaining coarse settling since the charge transfer would be more complete and, hence, the smaller the required on resistance of sw1*f*<i>, allowing a smaller $W_i$.

As a result, an optimized settling behavior can be obtained, for a given residual offset level defining the scaling factor s, by the proper sizing of the sw1*f*<P:1> gate area (essentially, the width $W_P, \ldots, W_1$) and the sampling edge delay $T_{DLY\_P}, \ldots, T_{DLY\_P}$.

Any advantageous scaling law can be followed to size the width $W_i$ and the time intervals $T_{DLY\_i}$, a natural choice being the following relations: $W_P < \ldots < W_1$ and $T_{DLY\_P} < \ldots < T_{DLY\_1}$ (in other words, the smaller the gate area of a given slow switch, the closer to the sampling instant it opens). In practice, one or two additional switching levels (P≤3) can be enough to obtain the required improvement over the approach shown in FIG. 2.

For example, the slow switch sw1*s*, e.g., first transistor, can have a width W/s, a first fast switch sw1*f*(1), e.g., second transistor, can have a width of W/s1, and a second fast switch sw1*f*(2), e.g., third transistor, can have a width of W/s2, where W/s<W/s1<W/s2 (s>s1>s2) if the second transistor opens after the third transistor, and both the second and third transistors open before the first transistor.

The Parallel Switching Technique has been presented in the context of a typical SC fully-differential integrator. However, the technique would be applicable to any SC integrator topology by replacing the corresponding RHS switches by the approach shown in FIG. 3 (or its generalization, shown by FIG. 4).

The technique is directly applicable to any SC integrator that does not imply a modification to the RHS switches structure and operation described as an example in this disclosure. For instance, the integrator can sample differentially against the opposite input instead to the input common mode $V_{ICM}$ (as the instance described before and illustrated in FIG. 1). In such a case, the Parallel Switching Technique would be applicable.

More importantly, the technique is directly applicable even in cases where the RHS switches structure and/or operation of the SC integrator depart from the one described as an example in this disclosure. For instance, the integrator can integrate during both phases instead of during only one phase (as the instance described before and illustrated in FIG. 1) by doubling the input branches (and, hence, the complementary RHS switches). In this case, the Parallel Switching Technique would be equally applied to all the RHS switches based on the same described principles and, potentially, obtaining the same improvements.

The Parallel Switching Technique is directly applicable to single-ended implementations also, since it does not rely on the differential nature and/or operation of its components as a principle of operation.

The application of the Parallel Switching Technique can be extended to other switches connecting to the summing nodes of a SC integrator whose charge injection can be eventually conveyed to the output, such as:

The RHS switches of SC branches connected to a reference voltage instead of an input voltage; for example, the Digital-to-Analog Converter (DAC) branches in an integrator of a discrete time Sigma-Delta Modulator that processes the feedback.

The RHS switches of SC branches connected to a calibration voltage instead of an input voltage to adjust the offset, gain error or other metric of the integrator.

The switches of the input chopper of the integrator's amplifier, possibly used to mitigate its offset and/or low frequency noise.

In general, the Parallel Switching Technique presented in this disclosure is advantageously applicable (with minor differences) to any switch connected to the summing node of a SC integrator, particularly if the switch is operated cyclically.

The disclosure has focused on the important case of Integrated Circuits (IC); however, the principles are equally applicable to discrete circuit implementations of SC integrators.

In one non-limiting specific example of an implementation, the switched-capacitor integrator of this disclosure can be used in a sigma-delta analog-to-digital converter. A non-limiting example of a sigma-delta analog-to-digital converter using a switched capacitor integrator is described in commonly assigned U.S. Pat. No. 9,124,290 to Sherry et al. and titled "Method and Apparatus for Separating the Reference Current from the Input Signal in Sigma-Delta Converter," the entire contents of which being incorporated herein by reference.

Figure 5:
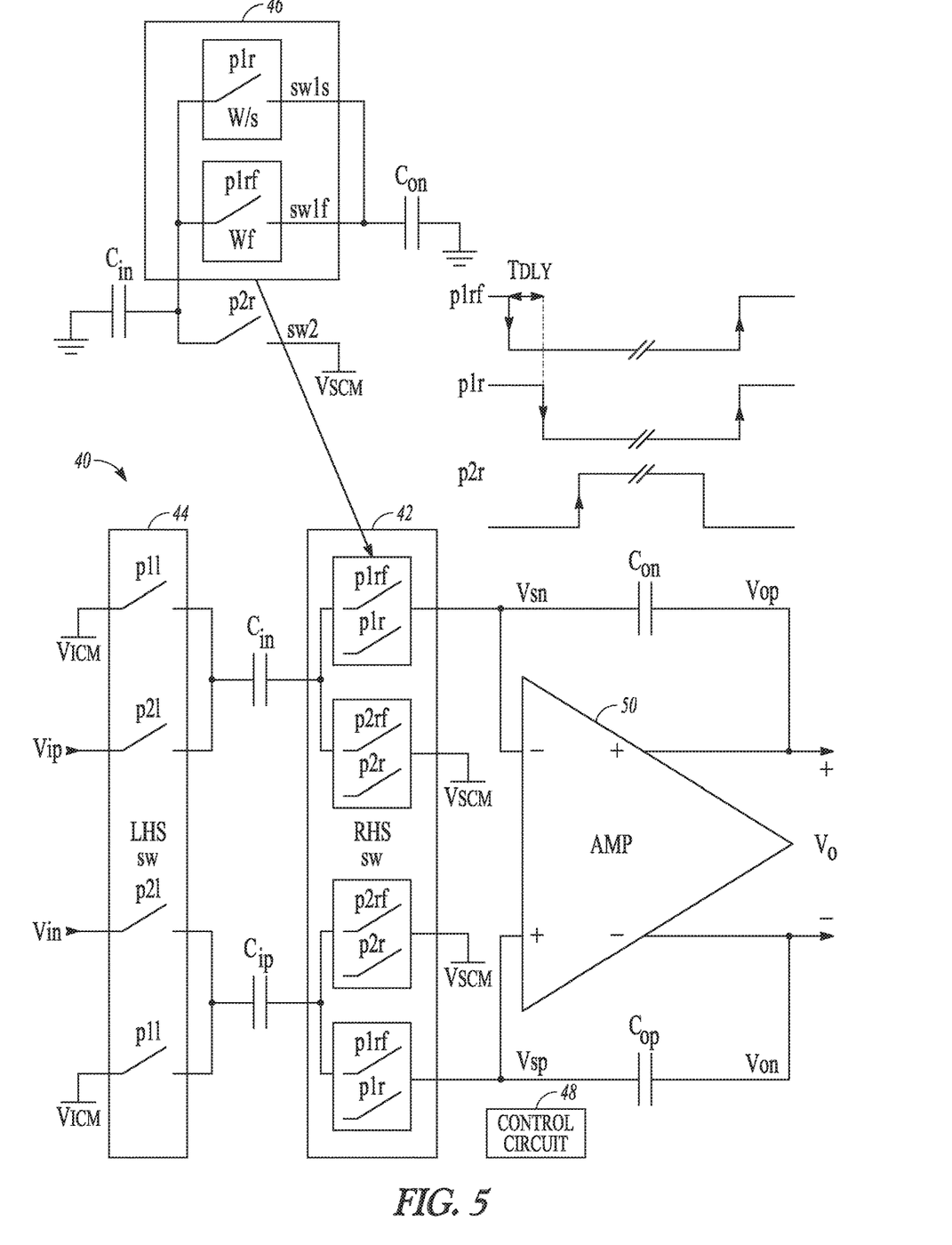
FIG. 5 is a schematic diagram of another example of a switched capacitor integrator that can implement the Parallel Switching Techniques of this disclosure.

FIG. 5 is a schematic diagram of another example of a switched capacitor integrator that implements the Parallel Switching Techniques of this disclosure. The fully-differential SC integrator circuit 40 in FIG. 5 can be formed by an amplifier (amp) 42 operating in a negative feedback configuration through some feedback capacitors $C_{op}$, $C_{on}$ connected between the output nodes $V_{op}$, $V_{on}$ and the summing nodes $V_{sp}$, $V_{sn}$, and a SC input network that conveys a charge to $V_{sp}$, $V_{sn}$ from the differential input $V_i = V_{ip} - V_{in}$. The feedback capacitors $C_{op}$, $C_{on}$ retain the state of the differential output $V_o = V_{op} - V_{on}$ of the integrator.

A set of switches, e.g., transistors, connect the Right-Hand-Side (RHS) terminals of the input capacitors $C_{ip}$, $C_{in}$ to the summing nodes $V_{sp}$, $V_{sn}$. These switches are labelled as RHS switches 42. Another set of switches, e.g., transistors, connect the Left-Hand-Side (LHS) terminals of $C_{ip}$, $C_{in}$ to the input terminals $V_{ip}$, $V_{in}$. These switches are labelled as LHS switches 44.

As seen in the example configuration shown in FIG. 5, all of the RHS switches, e.g., the ones connecting the input capacitors $C_{ip}$, $C_{in}$ and the summing nodes $V_{sp}$, $V_{sn}$, have been replaced with the proposed topology of FIG. 3 having at least one fast switch and a slow switch in parallel such that the differential integrator circuit 40 includes at least one compound switch in each differential input branch. That is, each of the RHS switches of FIG. 1 have been replaced with a compound switch including a small, slow switch sw1*s* having a first width (W/s) and a larger, fast switch sw1*f* having a second width ($W_f$) greater than the first width, as shown in the enlarged section 46. In some example configurations, the scaling factor s is within a range of 5 and 20, inclusive.

The switch sw1*s* is driven by the phase p1*r* and the switch sw1*f* is driven by the phase p1*rf*, as seen in FIG. 5. The timing of the switches is controlled by a control circuit 48. The control circuit is configured to control operation of the first and second switches, e.g., transistors, of the compound switch such that while the first switch sw1*s* is closed, the second switch sw1*f* is opened, and then the first switch sw1*s* is opened.

Additionally or alternatively, in some example configurations, the Parallel Switching Technique can be applied to one or more of the LHS switches, e.g., 16 in FIG. 1.

In some example configurations, a compound switch can be coupled between an input independent voltage and an input capacitor, e.g. replacing the RHS switches driven by p2r in FIG. 1, as illustrated in FIG. 5.

Notes

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A switched-capacitor integrator circuit including an amplifier, at least one input capacitor configured to receive at least one input signal and to convey it to an input of the amplifier, and at least one capacitor coupled to the amplifier in a feedback configuration, the switched capacitor integrator circuit comprising:
    at least one compound switch coupled between a corresponding plate of the at least one input capacitor and the input of the amplifier, wherein the at least one compound switch includes a parallel combination of:
        a first transistor having a first width; and
        a second transistor having a second width greater than the first width,
    wherein a control circuit is configured to control operation of the first and second transistors of the at least one compound switch such that while the first transistor is closed, the second transistor is opened, and then the first transistor is opened.

2. The switched-capacitor integrator circuit of claim 1, wherein the second transistor has a width W and the first transistor has a scaled width (W/s), wherein s is a scaling factor.

3. The switched-capacitor integrator circuit of claim 1, wherein the scaling factor is within a range of 5 and 20, inclusive.

4. The switched-capacitor integrator circuit of claim 1, wherein the at least one compound switch further includes:
    at least one third transistor, wherein the at least one third transistor has a third width, wherein the at least one third transistor is parallel to the first and second transistor, and wherein the at least one third transistor is configured to open while the first transistor is closed.

5. The switched-capacitor integrator circuit of claim 1, wherein the control circuit is configured to control operation of the first transistor using a first clock signal and control operation of the second transistor using a second clock signal, wherein the first clock signal is different from the second clock signal.

6. The switched-capacitor integrator circuit of claim 5, wherein the first clock signal has a first active time and the second clock signal has a second active time, and wherein the second active time is shorter than the first active time.

7. The switched-capacitor integrator circuit of claim 1, wherein the integrator circuit is a differential integrator circuit having at least one compound switch symmetrically in each differential input branch.

8. The switched-capacitor integrator circuit of claim 1, wherein the at least one compound switch is configured to be coupled between an input independent voltage and the at least one input capacitor.

9. The switched-capacitor integrator circuit of claim 1, in combination with a sigma-delta analog-to-digital converter circuit.

10. A method of operating a switched-capacitor integrator circuit including an amplifier, at least one input capacitor configured to receive at least one input signal and to convey it to an input of the amplifier, at least one capacitor coupled to the amplifier in a feedback configuration, and at least compound switch coupled between a corresponding plate of the at least one input capacitor and the input of the amplifier, the method comprising:
   controlling operation of the compound switch having a parallel combination of:
      a first transistor having a first width; and
      a second transistor having a second width greater than the first width, including:
   turning the second transistor OFF while the first transistor is ON and then turning the first transistor OFF.

11. The method of claim 10, wherein controlling operation of the at least one compound switch includes:
   applying a first clock signal to the first transistor; and
   applying a second clock signal to the second transistor, wherein the first clock signal is different from the second clock signal.

12. The method of claim 11, wherein applying the first clock signal to the first transistor includes applying the first clock signal for a first active time, and
   wherein applying the second clock signal to the second transistor includes
   applying the second clock signal for a second active time, wherein the second active time that is shorter than the first active time.

13. The method of claim 10, wherein turning the second transistor OFF while the first transistor is ON and then turning the first transistor OFF is during a sampling phase, the method further comprising:
   turning the first and second transistors ON to begin an integration phase.

14. The method of claim 10, wherein controlling operation of the at least one compound switch includes:
   coupling the at least one compound switch between an input of the amplifier and the at least one input capacitor.

15. The method of claim 10, wherein controlling operation of the at least one compound switch includes:
   coupling the at least one compound switch between an input configured to receive at least one input signal and the at least one input capacitor.

16. The method of claim 10, wherein controlling operation of the at least one compound switch includes:
   coupling the at least one compound switch between an input independent voltage and the at least one input capacitor.

17. An analog-to-digital converter circuit comprising:
   a switched-capacitor integrator circuit including an amplifier, an input capacitor configured to receive an input signal, and a capacitor coupled to the amplifier in a feedback configuration, the switched capacitor integrator circuit comprising:
      at least one compound switch coupled between a corresponding plate of the input capacitor and an input of the amplifier, wherein the compound switch includes a parallel combination of:
         a first transistor having a first width; and
         a second transistor having a second width greater than the first width,
      wherein a control circuit is configured to control operation of the first and second transistors of the at least one compound switch such that while the first transistor is closed, the second transistor is opened, and then the first transistor is opened.

18. The analog-to-digital converter circuit of claim 17, wherein the second transistor has a width W and the first transistor has a scaled width (W/s), wherein s is a scaling factor.

19. The analog-to-digital converter circuit of claim 17, wherein the at least one compound switch further includes:
   at least one third transistor, wherein the at least one third transistor has a third width, wherein the at least one third transistor is parallel to the first and second transistor, and wherein the at least one third transistor is configured to open while the first transistor is closed.

20. The analog-to-digital converter circuit of claim 17, wherein the control circuit is configured to control operation of the first transistor using a first clock signal and control operation of the second transistor using a second clock signal, wherein the first clock signal is different from the second clock signal.

21. The analog-to-digital converter circuit of claim 20, wherein the first clock signal has a first active time and the second clock signal has a second active time, and wherein the second active time is shorter than the first active time.

* * * * *